(12) United States Patent
Noda et al.

(10) Patent No.: US 8,648,340 B2
(45) Date of Patent: Feb. 11, 2014

(54) SEMICONDUCTOR DEVICE FOR DRIVING ELECTRIC MOTOR

(75) Inventors: Tomoya Noda, Okazaki (JP); Shigeki Nagase, Nabari (JP)

(73) Assignee: JTEKT Corporation, Osaka-Shi (JP)

( * ) Notice: Subject to any disclaimer, the term of this patent is extended or adjusted under 35 U.S.C. 154(b) by 143 days.

(21) Appl. No.: 13/181,053

(22) Filed: Jul. 12, 2011

(65) Prior Publication Data

US 2012/0018725 A1    Jan. 26, 2012

(30) Foreign Application Priority Data

Jul. 23, 2010   (JP) .................... 2010-166155

(51) Int. Cl.
*H01L 23/58*    (2006.01)
(52) U.S. Cl.
USPC ....... 257/48; 257/773; 257/784; 257/E29.111
(58) Field of Classification Search
USPC ................. 257/48, 748, 773, 784, E29.111
See application file for complete search history.

(56) References Cited

U.S. PATENT DOCUMENTS

| | | | |
|---|---|---|---|
| 6,008,542 A | * | 12/1999 | Takamori ................. 257/773 |
| 7,745,952 B2 | * | 6/2010 | Nakatsu et al. ............ 307/9.1 |
| 2003/0173667 A1 | | 9/2003 | Yong et al. |

FOREIGN PATENT DOCUMENTS

| | | | | |
|---|---|---|---|---|
| JP | A-7-221102 | | 8/1995 | |
| JP | 2002-329742 | * | 11/2002 | ............ H01L 21/60 |
| JP | A-2002-329742 | | 11/2002 | |
| JP | A-2005-527968 | | 9/2005 | |

* cited by examiner

*Primary Examiner* — A. Sefer
*Assistant Examiner* — Farid Khan
(74) *Attorney, Agent, or Firm* — Oliff PLC

(57) ABSTRACT

A FET for driving an electric motor includes a source electrode. The source electrode has main electrode surfaces to which bonding wires, through which a drive current for an electric motor passes, are joined, and inspection electrode surfaces that are arranged so as to be independent of and apart from the main electrode surfaces. The inspection electrode surfaces are provided so as to contact a probe of an inspection device that performs an inspection of the FET 3.

16 Claims, 2 Drawing Sheets

SEMICONDUCTOR DEVICE FOR DRIVING ELECTRIC MOTOR

INCORPORATION BY REFERENCE

The disclosure of Japanese Patent Application No. 2010-166155 filed on Jul. 23, 2010 including the specification, drawings and abstract is incorporated herein by reference in its entirety.

BACKGROUND OF THE INVENTION

1. Field of the Invention

The invention relates to a semiconductor device for driving an electric motor.

2. Description of Related Art

An electric power steering system for a vehicle includes an electric motor, for example, a brushless motor, and a drive circuit. The drive circuit drives the electric motor. The drive circuit includes a switching device (semiconductor device), for example, a MOSFET. The switching device is installed on a substrate in, for example, a bare chip state. Bonding wires are joined to, for example, a source electrode of the switching device that is installed on the substrate. The bonding wires are joined to coils of the electric motor. The bonding wires connect, for example, the source electrode of the switching device that is installed on the substrate to the coils of the electric motor.

The drive circuit including the switching device is subjected to an inspection before factory shipment. The inspection is performed, for example, with an inspection probe placed in contact with a surface of the source electrode. For example, Japanese Patent Application Publication No. 2002-329742 (JP 2002-329742 A) and Japanese Patent Application Publication No. 2005-527968 (JP 2005-527968 A) each describe a semiconductor device inspection method in which a probe is used.

A surface of an electrode of a semiconductor device described in each of JP 2002-329742 A and JP 2005-527968 A has a region to which a bonding wire is joined and a region that an inspection probe contacts. The region to which the bonding wire is joined is contiguous with the region that the inspection probe contacts. However, this structure is formulated without giving special consideration regarding an inspection of a switching device for driving an electric motor. When the switching device for driving the electric motor drives the electric motor, a high electric current passes through the switching device for driving the electric motor. Therefore, in an inspection of the switching device for driving the electric motor, a special probe may be used instead of a commonly-used probe. This special probe is different in shape from a commonly-used probe. For example, an end portion of the special probe has a needlepoint-holder shape. The end portion of the special probe having a needlepoint-holder shape has a plurality of sharp contact portions that contact the surface of the electrode of the switching device. Alternatively, an end portion of a special probe is significantly thick. Therefore, the end portion of the special probe contacts the surface of the electrode of the switching device, at a wider region than an end portion of a commonly-used probe. Accordingly, the end portion of the special probe needs to be brought into contact with the surface of the electrode of the switching device after being accurately positioned with respect to the surface of the electrode of the switching device so that the end portion of the special probe does not contact the region to which the bonding wire is joined.

However, as described above, with the configuration in each of JP 2002-329742 A and JP 2005-527968 A, in the surface of the electrode of the semiconductor device, the region to which the bonding wire is joined and the region that the inspection probe contacts are contiguous with each other. Therefore, it is difficult to distinguish between the region to which the bonding wire is joined the region that the inspection probe contacts. Accordingly, when a worker performs an inspection using the probe, there is a possibility that the worker will erroneously bring the end portion of the inspection probe into contact with the region to which the bonding wire is joined, thereby making a scratch on this region. The scratch made by the inspection probe on the region to which the bonding wire is joined may cause the bonding wire to be poorly joined the bonding wire joined region.

Further, when the worker performs an inspection of the switching device using the inspection probe, it takes a long time for the worker to distinguish between the region to which the bonding wire is joined and the region that the inspection probe contacts, which reduces the production efficiency. As a result, the production cost increases. Meanwhile, an inspection of the switching device may be performed using an automatic inspection device. In this case, the following inspection method may be employed. The automatic inspection device first captures an image of the surface of the electrode of the switching device using a camera. Next, the automatic inspection device distinguishes between the region to which the bonding wire is joined and the region that the inspection probe contacts using an image processing device. Next, the automatic inspection device moves the inspection probe using, for example, a robot arm to bring the inspection probe into contact with the inspection probe contact region.

Even when the inspection of the switching device is performed using the automatic inspection device, there may be caused a problem similar to that when a worker performs an inspection of the switching device using the inspection probe. The problem is that it is difficult to distinguish between the region to which the bonding wire is joined and the region that the inspection probe contacts. The automatic inspection device may misidentify the region to which the bonding wire is joined as the region that the inspection probe contacts, or misidentify the region that the inspection probe contacts as the region to which the bonding wire is joined. In this case as well, there is a possibility that the automatic inspection device will erroneously bring the end portion of the inspection probe into contact with the region to which the bonding wire is joined, thereby making a scratch on this region. When an inspection of the switching device is performed using the automatic inspection device, a high-quality image processing device including a high-resolution camera is required to reliably distinguish between these two regions, which increases the cost.

SUMMARY OF THE INVENTION

It is an object of the invention to minimize the possibility of poor connection while suppressing the production cost in a semiconductor device for driving an electric motor.

An aspect of the invention relates to a semiconductor device for driving an electric motor, which includes a predetermined electrode. The predetermined electrode has a main electrode surface to which a conductive member, through which a drive current for the electric motor passes, is joined, and an inspection electrode surface that is arranged so as to be independent of and apart from the main electrode surface and that contacts a contact portion of an inspection device that performs an inspection of the semiconductor device.

BRIEF DESCRIPTION OF THE DRAWINGS

The foregoing and further features and advantages of the invention will become apparent from the following description of example embodiments with reference to the accompanying drawings, wherein like numerals are used to represent like elements and wherein:

FIGS. 2A and 2B are views for illustrating an inspection of a FET (Field Effect Transistor), wherein FIG. 2A is a schematic perspective view showing an inspection device and the FET, and FIG. 2B is a schematic perspective view for illustrating the state of the inspection.

DETAILED DESCRIPTION OF EMBODIMENTS

Figure 1:
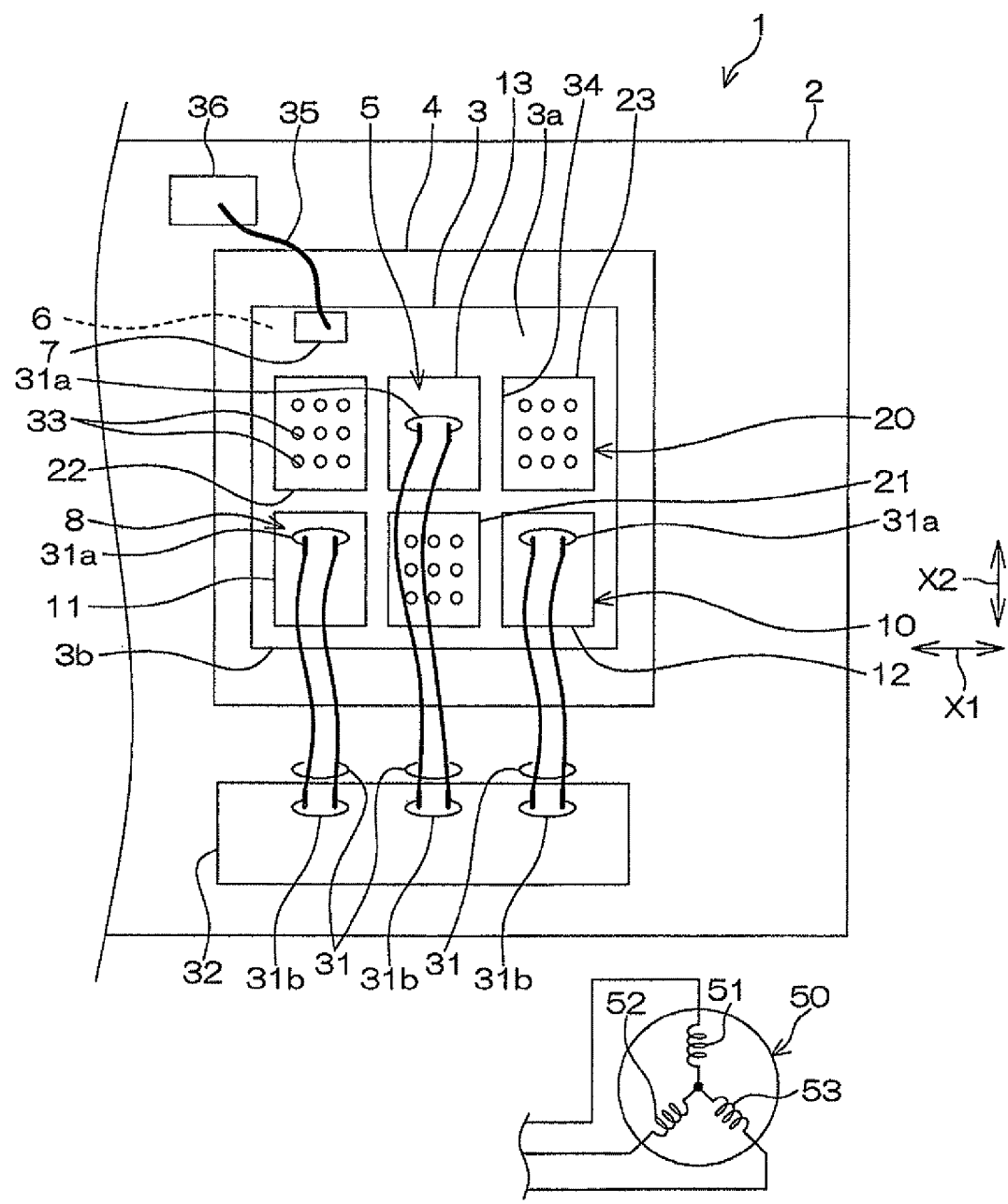
FIG. 1 is a plain view schematically showing a main portion of a device installation substrate including a semiconductor device according to an embodiment of the invention.

An embodiment of the invention will be described with reference to the accompanying drawings. FIG. 1 is a plain view schematically showing a main portion of a device installation substrate 1 including a semiconductor device according to an embodiment of the invention. As shown in FIG. 1, the device installation substrate 1 is, for example, a power substrate used to drive an electric motor 50 of an electric power steering system. The device installation substrate 1 supplies electric power to a U-phase coil 51, a V-phase coil 52, a W-phase coil 53 of the electric motor 50 via a connection member, for example, a bus bar (not shown). The electric motor 50 is driven by the electric power.

The device installation substrate 1 includes a substrate body 2 and a FET 3 that serves as a semiconductor device installed on the substrate body 2. The substrate body 2 is, for example, a multilayer circuit substrate in which conductor layers are formed between multiple insulation layers. A pad 4 is formed on a surface of the substrate body 2. The FET 3 is installed on the pad 4.

The FET 3 is, for example, a MOSFET (Metal Oxide Semiconductor Field Effect Transistor), and is a switching device. Also, the FET 3 is a power FET used to drive the electric motor 50. A high current (for example, several tens of amperes of current) passes through the FET 3. The FET 3 is a semiconductor chip. The FET 3 is installed on the substrate body 2 in a bare ship state. The FET 3 includes a source electrode 5 that serves as a predetermined electrode according to the invention, a drain electrode 6 and a gate electrode 7.

The drain electrode 6 is exposed at a back surface of the FET 3. The drain electrode 6 and the pad 4 are joined together by a solder member (not shown). The source electrode 5 is a predetermined electrode, and is a single electrode (only one source electrode is provided). The source electrode 5 is exposed at a surface 3a of the FET 3. The source electrode 5 includes an electrode surface 8 that is a pad formed on the surface 3a of the FET 3. The electrode surface 8 includes main electrode surfaces 10 and inspection electrode surfaces 20. The inspection electrode surfaces 20 are arranged so as to be independent of and apart from the main electrode surfaces 10. More specifically, the main electrode surfaces 10 and the inspection electrode surfaces 20 are arranged so as to be independent of and apart from each other in a planar view of the FET 3.

The main electrode surfaces 10 are provided so as to be joined to bonding wires 31 used as conductive members. The inspection electrode surfaces 20 are provided in order to perform an inspection of the FET 3 at the time of production of the FET 3 or at the time of production of the device installation substrate 1. A plurality of (for example, three in the embodiment) the main electrode surfaces 10 is provided. The main electrode surfaces 10 include a first main electrode surface 11, a second main electrode surface 12, and a third main electrode surface 13. In the following description, the main electrode surfaces 11, 12 and 13 may be collectively referred to as the main electrode surfaces 10 where appropriate.

Each of the main electrode surfaces 11, 12 and 13 is formed in a rectangular shape in a planar view, and is formed in a smooth surface. First ends 31a of the bonding wires 31 used as the conductive members are joined to the main electrode surfaces 11, 12 and 13 through wire bonding. Second ends 31b of the bonding wires 31 are joined to a pad 32 formed in the substrate body 2. The same number of (for example, two in the embodiment) bonding wires 31 are connected to each of the main electrode surfaces 11, 12 and 13. A drive current for the electric motor 50 passes through each bonding wire 31.

A plurality of (three in the embodiment, which is the same number as the number of the main electrode surfaces 10) the inspection electrode surfaces 20 is provided. The inspection electrode surfaces 20 include a first inspection electrode surface 21, a second inspection electrode surface 22 and a third inspection electrode surface 23. In the following description, the inspection electrode surfaces 21, 22 and 23 may be collectively referred to as the inspection electrode surfaces 20 where appropriate. Each of the inspection electrode surfaces 21, 22 and 23 is formed in the same shape as each of the main electrode surfaces 11, 12 and 13. That is, each of the inspection electrode surfaces 21, 22 and 23 is formed in a rectangular shape in a planar view. A plurality of recesses 33 is formed in each of the inspection electrode surfaces 21, 22 and 23. The recesses 33 are minute indentations that are formed when probes 46 of an inspection device 40, described below, contact each of the inspection electrode surfaces 21, 22 and 23.

The main electrode surfaces 10 and the inspection electrode surfaces 20 are alternately arranged along a predetermined first alignment direction X1. The first alignment direction X1 is parallel to, for example, a one side portion 3b of the FET 3. More specifically, the first main electrode surface 11, the first inspection electrode surface 21 and the second main electrode surface 12 are aligned in this order along the first alignment direction X1. In a planar view, a second alignment direction X2 is perpendicular to the first alignment direction X1. The second inspection electrode surface 22, the third main electrode surface 13 and the third inspection electrode surface 23 are arranged so as to be aligned with the first main electrode surface 11, the first inspection electrode surface 21 and the second main electrode surface 12, respectively, in the second alignment direction X2. The second inspection electrode surface 22, the third main electrode surface 13 and the third inspection electrode surface 23 are arranged in this order at regular intervals along the first alignment direction X1.

With the structure described above, the main electrode surfaces 10 are provided in a staggered arrangement in a planar view. The main electrode surfaces 11, 12 and 13 and the inspection electrode surfaces 21, 22 and 23 are separated in a grid pattern by a passivation film 34 of the surface 3a of the FET 3. The passivation film 34 is an insulating film that is produced at the time of production of the FET 3, and is, for example, black. The passivation film 34 differs in color from the main electrode surfaces 10 and the inspection electrode surfaces 20.

Each of the bonding wires 31 joined to the first main electrode surface 11 and the second main electrode surface 12 does not straddle any inspection electrode surface 20. On the other hand, the bonding wires 31 joined to the third main electrode surface 13 straddle the inspection electrode surface 20 (first inspection electrode surface 21). As described above, the number of bonding wires 31 that straddle the inspection electrode surface 20 is smaller than the number of bonding wires 31 that do not straddle any inspection electrode surface 20.

The gate electrode 7 is exposed at the surface 3a of the FET 3. The gate electrode 7 is arranged on the surface 3a of the FET 3 so as to be apart from the source electrode 5. One end of a bonding wire 35 is joined to the gate electrode 7. The other end of the bonding wire 35 is bonded to a pad 36 formed on the surface of the substrate body 2.

Next, an inspection of the FET 3 will be described. The inspection of the FET 3 is performed when the FET 3 is alone or is installed on the substrate body 2, before wire bonding is performed.

Figure 2A:
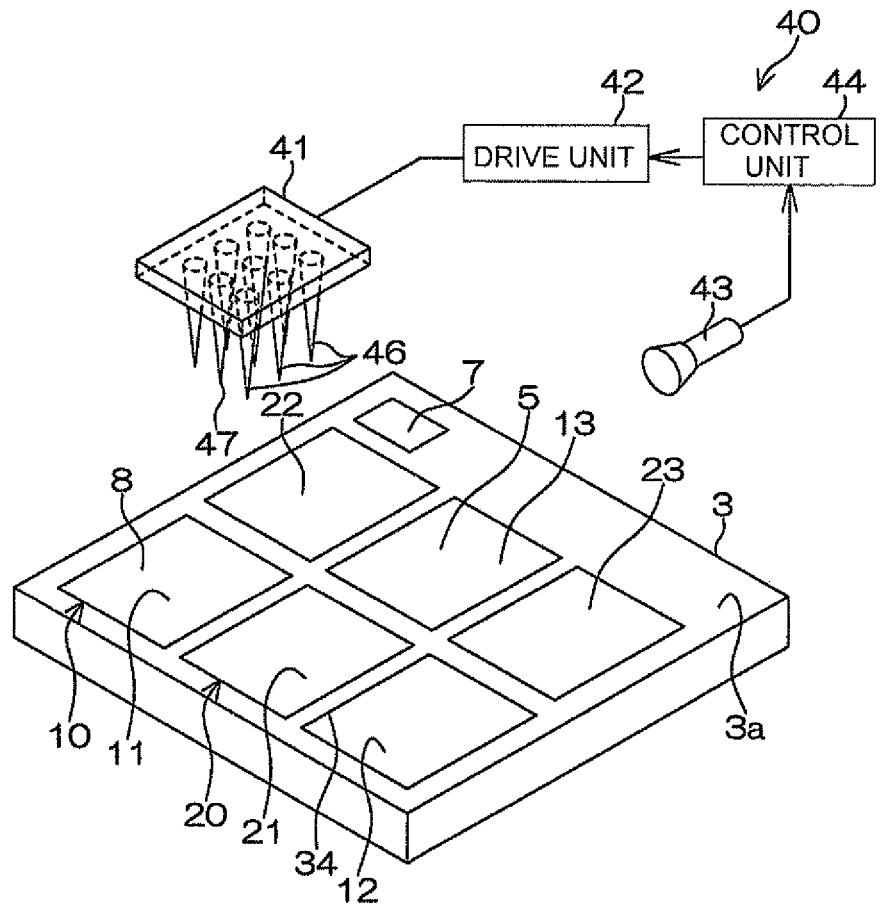
Figure 2B:
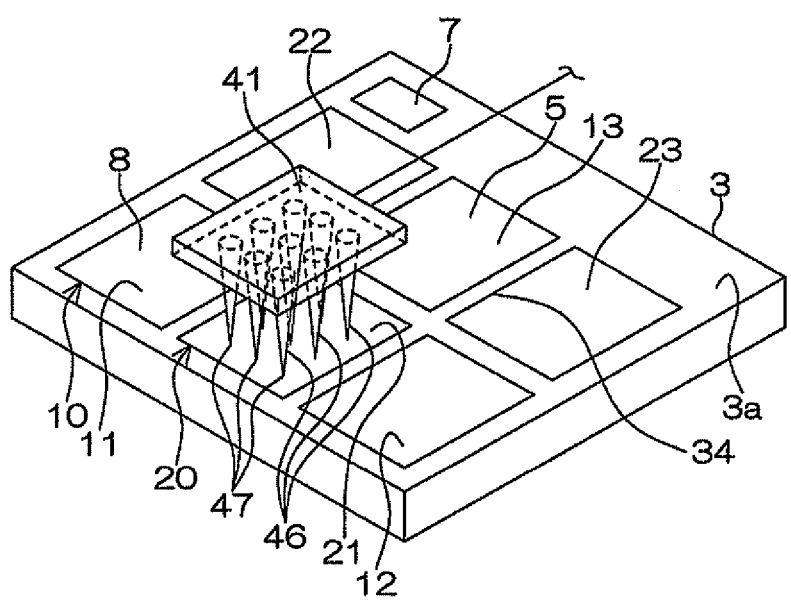

FIG. 2 is a view for illustrating the inspection of the FET 3. FIG. 2A is a schematic perspective view showing the inspection device 40 and the FET 3. FIG. 2B is a schematic perspective view showing the state of the inspection. As shown in FIG. 2A and FIG. 2B, a characteristic inspection of the FET 3 is performed automatically by the inspection device 40 (without a manual work). The inspection device 40 includes a probe unit 41, a drive unit 42, a camera 43, and a control unit 44. The drive unit 42 adjusts the position of the probe unit 41. The camera 43 is image capturing means. The control unit 44 includes a CPU, etc. The control unit 44 controls the probe unit 41, the drive unit 42 and the camera 43.

The probe unit 41 includes a plurality of probes 46. The probe unit 41 has a needlepoint-holder shape as a whole. Each probe 46 is, for example, a current probe. Each probe 46 has a contact portion 47 that is brought into contact with the inspection electrode surface 20 of the FET 3. Each contact portion 47 is formed at a tip end portion of the probe 46. Each contact portion 47 is formed in a sharp-pointed shape. Because a plurality of contact portions 47 is formed in the probe unit 41, the total area of a region of the FET 3, which the contact portions 47 contact, is large in a planar view. Because a plurality of the probes 46 having the contact portions 47 at their tip ends is provided, it is possible to perform an inspection of the FET 3 while applying a large load (high current) to the FET 3. Thus, it is possible to perform an inspection under a condition intended to represent an actual usage situation of the FET 3.

The control unit 44 causes the camera 43 to capture the image of the surface 3a of the FET 3. Also, the control unit 44 distinguishes between the main electrode surfaces 10 and the inspection electrode surfaces 20 based on the image data captured by the camera 43, the data stored in the ROM in advance, etc. The control unit 44 drives the drive unit 42 to bring the contact portion 47 of each probe 46 into contact with each inspection electrode surface 20 that has been distinguished from the main electrode surfaces 10.

Thus, as shown in FIG. 2B, the contact portions 47 of the probes 46 are pressed to, for example, the first inspection electrode surface 21. In this state, the characteristic inspection of the FET 3 is performed. At this time, recesses (see FIG. 1) are formed in the first inspection electrode surface 21. The contact portions 47 of the probes 46 may be pressed to only one or two inspection electrode surfaces 20 (for example, the inspection electrode surfaces 21 and 22), or may be pressed to all the inspection electrode surfaces 21, 22 and 23. If the contact portions 47 of the probes 46 are pressed to all the inspection electrode surfaces 21, 22 and 23, a plurality of the probe units 41 or a large probe unit having a plurality of the probe units 41 corresponding to the respective inspection electrode surfaces 21, 22 and 23 may be provided and the contact portions 47 of these probe units 41 or the contact portion 47 of the large probe unit may be pressed to the inspection electrode surfaces 21, 22 and 23 at the same time. Alternatively, the contact portions 47 of one probe unit 41 may be pressed to the inspection electrode surfaces 21, 22 and 23 at different times. The probe unit 41 may be manually operated by a worker (inspector) instead of being operated by the drive unit 42.

As described above, according to the embodiment, the main electrode surfaces 10 and the inspection electrode surfaces 20 of the source electrode 5 are arranged so as to be independent of and apart from each other. Thus, it is possible to easily distinguish between the main electrode surfaces 10 and the inspection electrode surfaces 20. Therefore, it is possible to minimize the possibility that the worker or the inspection device 40 will misidentify the main electrode surface 10 as the inspection electrode surface 20 or misidentify the inspection electrode surface 20 as the main electrode surface 10. Accordingly, it is possible to minimize the possibility that the worker or the inspection unit 40 will erroneously bring the contact portions 47 of the probes 46 into contact with the main electrode surface 10. As a result, it is possible to minimize the possibility that the main electrode surface 10 will be scratched due to contact of the contact portions 47 of the probes 46 with the main electrode surface 10. Thus, it is possible to minimize the possibility that the bonding wires 31 will be poorly joined to the main electrode surface 10 through wire bonding.

According to the embodiment, it is possible to easily distinguish between the main electrode surfaces 10 and the inspection electrode surfaces 20. As a result, when an inspection is performed by a worker, the worker is able to quickly distinguish between the main electrode surfaces 10 and the inspection electrode surfaces 20. Thus, it is possible to increase the production efficiency to thereby suppress the production cost. Also, when an automatic inspection is performed using, for example, the drive unit 42, it is possible to use an inexpensive inspection device as the inspection device 40 to thereby suppress the production cost, because the accuracy of distinguishing between the main electrode surfaces 10 and the inspection electrode surfaces 20, which should be achieved by the inspection device 40, need not be so high. In addition, because the structure that is inexpensively achieved just by arranging the main electrode surfaces 10 and the inspection electrode surfaces 20 apart from each other is employed, it is possible to further reduce the production cost.

As described above, it is possible to solve, at low cost, the problem specific to the FET 3 which is used to drive the electric motor and through which a high current passes, that is, the problem that it is necessary to accurately distinguish between the main electrode surfaces 10 and the inspection electrode surfaces 20 due to, for example, the peculiar shape of the probe unit 41 of the inspection device 40. Further, it is possible to suppress occurrence of poor connection at the source electrode 5 through which high current passes. Further, the main electrode surface 11, the first inspection electrode surface 21 and the second main electrode surface 12 are arranged in this order along the first alignment direction X1. Because the main electrode surfaces 11 and 12 are connected to the bonding wires 31, the heat generation amount at these main electrode surfaces 11 and 12 is large. The multiple main electrode surfaces 11 and 12 at which the heat generation amount is large are arranged so as to be further apart from each other along the first alignment direction X1. Thus, the heat of each of the main electrode surfaces 11 and 12 is more easily released when the FET 3 is driven. Accordingly, it is possible to efficiently release the heat of the FET 3. In addition, the simple structure in which the main electrode surfaces 10 and the inspection electrode surfaces 20 are alternately arranged along the first alignment direction X1 is employed. As a result, it is possible to suppress the production cost.

Further, the main electrode surfaces 10 are provided in a staggered arrangement. As described above, in the electrode surface 8 of the source electrode 5, the main electrode surfaces 10 at which the heat generation amount is large are provided in a staggered arrangement. Thus, it is possible to more easily release the heat of each of the main electrode surfaces 11, 12 and 13 when the FET 3 is driven. Accordingly, it is possible to more efficiently release the heat of the FET 3. In addition, because the simple structure in which the main electrode surfaces 10 are provided in a staggered arrangement is employed, it is possible to suppress the production cost.

In addition, the main electrode surfaces 10 are separated from the inspection electrode surfaces 20 by the passivation film 34. Thus, it is possible to more reliably distinguish between the main electrode surfaces 10 and the inspection electrode surfaces 20. Further, the passivation film 34 is usually provided in the FET 3. Accordingly, it is not necessary to provide a special member for separating the main electrode surfaces 10 and the inspection electrode surfaces 20 from each other. As a result, the production cost is further suppressed.

The invention is not limited to the above-described embodiment, and various modifications may be made within the scope of claims.

For example, the probe unit may have only one probe. In this case, the tip end portion of the probe may be formed in a thick bar shape. Further, the main electrode surfaces 10 may be separated from the inspection electrode surfaces 20 by an insulation member other than the passivation film 34. Further, the number of each of the main electrode surface 10 and the inspection electrode surface 20 may be only one.

Further, the main electrode surfaces and the inspection electrode surfaces according to the invention may be provided in an electrode other than the source electrode, for example, in the drain electrode or the gate electrode. A MOSFET is used as the switching device in the embodiment described above. However, a switching device (semiconductor device) for driving an electric motor, for example, a FET other than a MOSFET or a transistor may be used.

What is claimed is:

1. A semiconductor device for driving an electric motor, comprising:
    a predetermined electrode including a main electrode surface and an inspection electrode surface,
    wherein:
    the main electrode surface is joined to a conductive member, and a drive current for the electric motor passes through the conductive member, and
    the inspection electrode surface is arranged so as to be independent of and apart from the main electrode surface and the inspection electrode surface contacts a contact portion of an inspection device that performs an electrical inspection of the semiconductor device.

2. The semiconductor device for driving an electric motor according to claim 1:
    wherein the semiconductor device includes a source electrode, a drain electrode and a gate electrode; and
    wherein the predetermined electrode is the source electrode.

3. The semiconductor device for driving an electric motor according to claim 1, wherein a plurality of the main electrode surfaces and a plurality of the inspection electrode surfaces are provided, and the main electrode surfaces and the inspection electrode surfaces are alternately arranged along a predetermined alignment direction.

4. The semiconductor device for driving an electric motor according to claim 2, wherein a plurality of the main electrode surfaces and a plurality of the inspection electrode surfaces are provided, and the main electrode surfaces and the inspection electrode surfaces are alternately arranged along a predetermined alignment direction.

5. The semiconductor device for driving an electric motor according to claim 1, wherein a plurality of the main electrode surfaces and a plurality of the inspection electrode surfaces are provided, and the main electrode surfaces are provided in a staggered arrangement.

6. The semiconductor device for driving an electric motor according to claim 2, wherein a plurality of the main electrode surfaces and a plurality of the inspection electrode surfaces are provided, and the main electrode surfaces are provided in a staggered arrangement.

7. The semiconductor device for driving an electric motor according to claim 3, wherein a plurality of the main electrode surfaces and a plurality of the inspection electrode surfaces are provided, and the main electrode surfaces are provided in a staggered arrangement.

8. The semiconductor device for driving an electric motor according to claim 4, wherein a plurality of the main electrode surfaces and a plurality of the inspection electrode surfaces are provided, and the main electrode surfaces are provided in a staggered arrangement.

9. The semiconductor device for driving an electric motor according to claim 1, wherein the main electrode surface is separated from the inspection electrode surface by a passivation film.

10. The semiconductor device for driving an electric motor according to claim 2, wherein the main electrode surface is separated from the inspection electrode surface by a passivation film.

11. The semiconductor device for driving an electric motor according to claim 3, wherein the main electrode surface is separated from the inspection electrode surface by a passivation film.

12. The semiconductor device for driving an electric motor according to claim 4, wherein the main electrode surface is separated from the inspection electrode surface by a passivation film.

13. The semiconductor device for driving an electric motor according to claim 5, wherein the main electrode surface is separated from the inspection electrode surface by a passivation film.

14. The semiconductor device for driving an electric motor according to claim 6, wherein the main electrode surface is separated from the inspection electrode surface by a passivation film.

15. The semiconductor device for driving an electric motor according to claim 7, wherein the main electrode surface is separated from the inspection electrode surface by a passivation film.

16. The semiconductor device for driving an electric motor according to claim 8, wherein the main electrode surface is separated from the inspection electrode surface by a passivation film.

* * * * *